(12) United States Patent
Onodera

(10) Patent No.: US 7,233,205 B2
(45) Date of Patent: Jun. 19, 2007

(54) TRANSISTOR BIASING INDEPENDENT OF INDUCTOR VOLTAGE DROP

(75) Inventor: Keith K. Onodera, Mountain View, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 141 days.

(21) Appl. No.: 11/078,246

(22) Filed: Mar. 11, 2005

(65) Prior Publication Data
US 2006/0202759 A1    Sep. 14, 2006

(51) Int. Cl.
*H03F 3/45*    (2006.01)
(52) U.S. Cl. ...................... 330/261; 330/283
(58) Field of Classification Search ............... 330/261, 330/283
See application file for complete search history.

(56) References Cited

U.S. PATENT DOCUMENTS

| | | | |
|---|---|---|---|
| 3,987,317 A | 10/1976 | Hongu et al. | |
| 6,023,196 A * | 2/2000 | Ashby et al. | ............... 330/290 |
| 6,255,885 B1 | 7/2001 | Brandt | |
| 7,071,779 B2 * | 7/2006 | Shi et al. | .................... 330/253 |

* cited by examiner

*Primary Examiner*—Steven J. Mottola
(74) *Attorney, Agent, or Firm*—Bever, Hoffman & Harms, LLP; Jeanette S. Harms

(57) ABSTRACT

A differential amplifier can include input transistors for receiving a differential input signal and an inductor connected to the input transistors. The inductor can protect a voltage supply from radio frequency in the differential input signal. The accuracy of this differential amplifier can be significantly improved by including a bias network. This bias network advantageously allows a bias current in the input transistors to be set independently of a voltage drop across the inductor.

4 Claims, 1 Drawing Sheet

TRANSISTOR BIASING INDEPENDENT OF INDUCTOR VOLTAGE DROP

BACKGROUND OF THE INVENTION

1. Field of the Invention

The present invention relates to transistor biasing, and in particular to transistor biasing independent of inductor voltage drop.

2. Related Art

Transistors are frequently used in radio frequency (RF) applications. Transistor biasing can advantageously facilitate amplification. A conventional amplifier can include various components to control its gain and distortion. For example, inductors can be used to provide a high impedance to alternating current, serving to "choke" off RF from DC supply lines in the amplifier. Such a high impedance inductive load may also serve to provide common mode rejection when used in the common node of a differential amplifier. Such an RF choke can be designed to have a high impedance over a wide range of frequencies. Unfortunately, biasing transistors with inductors in their source/emitter legs and using a replica current mirror circuit (a known implementation) can result in inaccurate biasing because of a voltage drop across one or more inductors.

One approach to solve this voltage drop problem is to create an equal voltage drop in the replica current mirror circuit using a metal resistor. This metal resistor must be large enough to match the inductor (or even larger if the replica current mirror circuit is a scaled, i.e. lower current, version for power saving). Unfortunately, this metal resistor may take up significant area on the integrated circuit.

Further, differential amplifiers have commonly used a constant voltage reference connected through resistors to produce a fixed voltage on the common current point which, when attached to a resistor to, for example, a ground potential, will produce a constant current equal to the sum of the currents in the output legs of the amplifier. This voltage drop across the resistor must necessarily be less than the total voltage drop across the differential amplifier, thereby limiting the amplifier's output voltage swing. Ever-decreasing feature sizes dictate ever-decreasing supply voltages, thus limiting the output voltage swing that may be achieved using existing biasing designs.

Therefore, a need arises for an amplifier that can accurately set its bias current independent of a voltage drop across an inductor. There is a further need for an amplifier circuit having a constant current design which maximizes the available voltage swing at its output for a given supply voltage.

SUMMARY OF THE INVENTION

In accordance with one aspect of the invention, a transistor bias in an amplifier can be provided, wherein such bias can advantageously be independent of a voltage drop across an inductor in the amplifier. In one embodiment, the amplifier can be a differential amplifier having input transistors for receiving a differential input signal and an inductor connected to the input transistors. The inductor can provide a high impedance to alternating current, thereby providing common mode signal rejection and protecting a voltage supply from radio frequency in the differential input signal. The accuracy of this differential amplifier can be significantly improved by including a bias network. This bias network advantageously allows a bias current in the input transistors to be set independently of a voltage drop across the inductor.

In one embodiment, an amplification network of the differential amplifier can include first through fourth transistors as well as a first inductor. The first transistor can have its control terminal receive a positive differential input signal IN+ whereas the second transistor can have its control terminal receive a negative differential input signal IN−. The third transistor can have its control terminal connected to a positive voltage supply VDD, its first terminal connected to a second terminal of the first transistor, and its second terminal coupled to VDD. The second terminal of the third transistor can provide a negative differential output signal OUT−. The fourth transistor can have its control terminal connected to VDD, its first terminal connected to the second terminal of the second transistor, and its second terminal coupled to VDD. The second terminal of the fourth transistor can provide a positive differential output signal OUT+. The first inductor can be connected between the first terminals of the first and second transistors and a low voltage supply VSS.

In one embodiment, the amplifier can further include a capacitor as well as first and second resistors. The first resistor can be connected between the control terminal of the first transistor and the capacitor. The second resistor can be connected between the control terminal of the second transistor and the capacitor. The capacitor is further connected to VSS. In another embodiment, second and third inductors can be connected between the second terminals of the third and fourth transistors, respectively, and VDD, thereby providing a resonant load for the third and fourth transistors, respectively.

The bias network can include fifth through tenth transistors. The fifth transistor can have its control terminal connected to the second terminals of the first and second resistors, and its first terminal connected to the first terminals of the first and second transistors. The sixth transistor can have its control terminal connected to VDD, and its first terminal connected to the second terminal of the fifth transistor. The seventh transistor can have its second terminal and control terminal connected to the second terminal of the sixth transistor, and its first terminal connected to VDD. The eighth transistor can have its control terminal connected to the control terminal of the seventh transistor, and its first terminal connected to VDD. The ninth transistor can have its second terminal and control terminal connected to the second terminal of the eighth transistor, and its first terminal connected to VSS. The tenth transistor can have its control terminal connected to the control terminal of the ninth transistor, its first terminal connected to VSS, and its second terminal for receiving the reference current Iref. In one embodiment, the first, second, third, fourth, fifth, sixth, ninth, and tenth transistors are npn or NMOS transistors, whereas the seventh and eighth transistors are pnp or PMOS transistors.

DETAILED DESCRIPTION OF THE FIGURES

Figure 1:
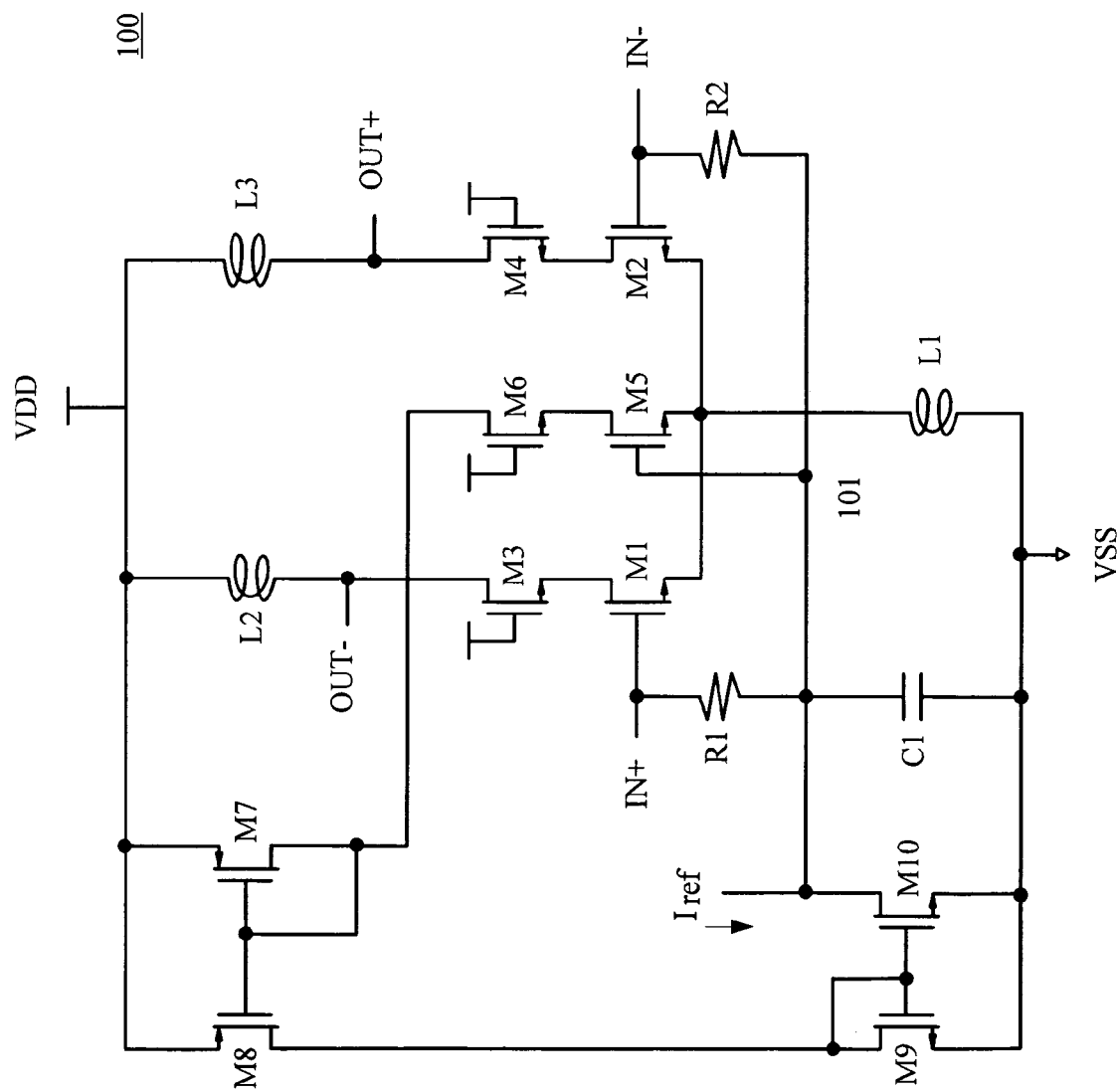
FIG. 1 illustrates an exemplary amplifier including inductors and a bias network that allows the bias current to be set independent of a voltage drop across an inductor.

In accordance with one aspect of the invention, a transistor bias in an amplifier can be provided, wherein such bias can advantageously be independent of a voltage drop across an inductor in the amplifier. FIG. 1 illustrates one embodiment of an amplifier 100 having input terminals for receiving a differential input signal IN+ and IN− and output terminals for providing a differential output signal OUT− and OUT+. Amplifier 100 can be characterized as including an amplification network and a bias network.

The amplification network can include transistors M1, M2, M3, and M4, resistors R1 and R2, inductors L1, L2, and L3, and a capacitor C1. In this embodiment, transistors M1, M2, M3, and M4 can provide basic amplification functionality, inductor L1 can provide an RF choke to protect the low voltage supply from RF, and inductors L2 and L3 may form a resonant load for transistors M3 and M4, respectively.

Note that a current source, e.g. reference current Iref in amplifier 100, can be characterized as an infinite impedance. Therefore, a node 101 receiving reference current Iref would exhibit a high impedance. In this case, the differential input signal IN+ and IN− could potentially affect reference current Iref via resistors R1 and R2. Capacitor C1, which forms a low impedance between node 101 and a low voltage supply VSS, can advantageously ground the RF of IN+ and IN−. Thus, capacitor C1 can function as a bypass capacitor coupled to minimize the effects of RF in amplification circuit 100.

The bias network can be characterized as including transistors M5, M6, M7, M8, M9, and M10. In accordance with one aspect of the invention, this bias network can advantageously set the bias current of transistor M5 independent of a voltage drop across inductor L1. In this embodiment, the bias network can set the bias current $I_B$ of transistor M5 to be:

$$I_B = Iref*(W9/W10)*(W7/W8) \quad \text{Eq. 1}$$

wherein W7, W8, W9, and W10 are the widths of transistors M7, M8, M9, and M10, respectively. Note that equation 1 assumes that transistors M7 and M8 have a first length and transistors M9 and M10 have a second length, wherein the first and second lengths may be the same or different.

In this bias network, current flowing through transistors M5 and M6 can be reflected in transistors M8 and M9. In this current mirror configuration, the reference current Iref can be balanced. Specifically, using resistors R1 and R2 and the common first terminal connection of transistors M1, M2 and M5 can advantageously force the bias current of transistors M1 and M2 to be a fixed multiple of transistor M5, but be independent of the voltage drop across inductor L1. Specifically, the size of transistor M1 (or M2) to transistor M5 sets the current ratio of transistor M1 (or M2) to transistor M5. In one embodiment, transistor M5 can be much smaller than transistor M1 (or M2) (e.g. 1:10).

An exemplary component configuration of amplifier 100 is now described. In amplifier 100, the differential input signal IN− and IN+is provided to the control terminals of transistors M1 and M2, respectively. The first terminals of transistors M1 and M2 are coupled to low voltage supply VSS via inductor L1. Transistors M3 and M4 have their first terminals connected to the second terminals of transistors M1 and M2, respectively, and their control terminals connected to positive voltage supply VDD. Inductors L2 and L3 are connected between VDD and the second terminals of transistors M3 and M4, respectively. A differential output signal OUT− and OUT+ is provided by the second terminals of transistors M3 and M4.

As described above, a bias network can be used to set a bias current of a transistor M5 having its first terminal commonly connected to the first terminals of transistors M1 and M2. This bias network can comprise transistors M5, M6, M9, and M10 as well as transistors M8 and M7.

The first terminal of transistor M6 is connected to the second terminal of transistor M5, its control terminal is connected to VDD, and its second terminal is connected to the second terminal of transistor M7. The first terminal of transistor M7 is connected to VDD whereas its second terminal and control terminal are connected to the control terminal of transistor M8. The first terminal of transistor M8 is connected to VDD and its second terminal is connected to the second terminal and control terminal of transistor M9. The first terminal of transistor M9 is connected to VSS. The second terminal of transistor M10 is connected to reference current Iref, its first terminal is connected to VSS, and its control terminal is connected to the control terminal of transistor M9.

The second terminal of transistor M10 is connected to the control terminal of transistor M5, thereby completing the feedback path. The second terminal of transistor M10 is further connected to first terminals of resistors R1 and R2, wherein second terminals of resistors R1 and R2 receive the input signals IN+ and IN−, respectively. A capacitor C1 has one terminal connected to the first terminals of resistors R1 and R2 and another terminal connected to VSS.

In one embodiment, transistors M1, M2, and M5 can be implemented using the same unit cell. Similarly, transistors M7 and M8 can be implemented using another unit cell. Transistors M9 and M10 can also be implemented using yet another unit cell.

In one embodiment, the reference current Iref can provide between 1 µA to 1 mA (e.g. 100 µA), capacitor C1 can provide 2.5 pF, and resistors R1 and R2 can each provide 10 kOhms.

In another embodiment, the cascode circuits formed by transistors M3, M4 and M6 with transistors M1, M2 and M5, respectively, may be eliminated. In this configuration, transistor M1 would connect directly to inductor L2 and transistor M2 would connect directly to inductor L3. The second terminal of transistor M5 would connect directly to the junction of the control terminal and the second terminal of transistor M7.

In still another embodiment, the current mirroring components M7–M10 may be replaced with fixed current reference Iref. In this configuration, scaling of the Iref signal is not performed in setting the current through transistor M5.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. An amplifier comprising:
   an amplification network including an inductor; and
   a bias network for accurately setting a bias current in the amplification network independently of a voltage drop across the inductor, wherein the amplification network includes:
   a first transistor having a control terminal for receiving a positive differential input signal;
   a second transistor having a control terminal for receiving a negative differential input signal;

a third transistor having a control terminal for receiving a positive voltage supply, a first terminal connected to a second terminal of the first transistor, and a second terminal coupled to the positive voltage supply, the second terminal providing a negative differential output signal;

a fourth transistor having a control terminal for receiving the positive voltage supply, a first terminal connected to a second terminal of the second transistor, and a second terminal coupled to the positive voltage supply, the second terminal providing a positive differential output signal;

a first inductor having a first terminal connected to the first terminals of the first and second transistors and a second terminal connected to a low voltage supply;

a first resistor having a first terminal connected to the control terminal of the first transistor, and a second terminal coupled to the low voltage supply, the second terminal receiving a reference current;

a second resistor having a first terminal connected to the control terminal of the second transistor, and a second terminal coupled to the low voltage supply, the second terminal receiving the reference current; and a capacitor connected between the second terminals of the first and second resistors and the low voltage supply.

2. The amplifier of claim 1, wherein the bias network includes:

a fifth transistor having a control terminal connected to the second terminals of the first and second resistors, and a first terminal connected to the first terminals of the first and second transistors;

a sixth transistor having a control terminal for receiving the positive voltage supply, and a first terminal connected to a second terminal of the fifth transistor;

a seventh transistor having a second terminal and a control terminal connected to a second terminal of the sixth transistor, and a first terminal connected to the positive voltage supply;

an eighth transistor having a control terminal connected to the control terminal of the seventh transistor, and a first terminal connected to the positive voltage supply;

a ninth transistor having a second terminal and a control terminal connected to a second terminal of the eighth transistor, and a first terminal connected to the low voltage supply; and a tenth transistor having a control terminal connected to the control terminal of the ninth transistor, a first terminal connected to the low voltage supply, and a second terminal for receiving the reference current.

3. The amplifier of claim 2, wherein the first, second, third, fourth, fifth, sixth, ninth, and tenth transistors are npn or NMOS transistors, and wherein the seventh and eighth transistors are pnp or PMOS transistors.

4. The amplifier of claim 2, further including:

a second inductor connected between the second terminal of the third transistor and the positive voltage supply; and a third inductor connected between the second terminal of the fourth transistor and the positive voltage supply.

* * * * *